(12) United States Patent
Dong et al.

(10) Patent No.: US 10,168,368 B1
(45) Date of Patent: Jan. 1, 2019

(54) THREE PHASE CONVERTING DEVICE AND METHOD FOR ESTIMATING CAPACITANCE

(71) Applicant: DELTA ELECTRONICS, INC., Taoyuan (TW)

(72) Inventors: Ming-Xuan Dong, Taoyuan (TW); Yan Ma, Taoyuan (TW); Chang-Yong Wang, Taoyuan (TW); Ai-Bin Qiu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/983,109

(22) Filed: May 18, 2018

(30) Foreign Application Priority Data

Aug. 2, 2017 (CN) .......................... 2017 1 0652487

(51) Int. Cl.
*H02M 7/757* (2006.01)
*G01R 27/26* (2006.01)
*H02M 7/5387* (2007.01)
*H02M 1/36* (2007.01)

(52) U.S. Cl.
CPC ...... *G01R 27/2605* (2013.01); *H02M 7/5387* (2013.01); *H02M 7/7575* (2013.01); *H02M 1/36* (2013.01)

(58) Field of Classification Search
None
See application file for complete search history.

(56) References Cited

U.S. PATENT DOCUMENTS

| 5,594,353 A | 1/1997 | Hemphill | |
|---|---|---|---|
| 2014/0119067 A1* | 5/2014 | Choi | G01R 31/028 363/37 |
| 2015/0270787 A1* | 9/2015 | Fujisaki | H02M 1/08 363/41 |
| 2016/0282392 A1* | 9/2016 | Lee | H02P 21/36 |
| 2018/0175775 A1* | 6/2018 | Yoshida | H02P 27/06 |

FOREIGN PATENT DOCUMENTS

| CN | 102495292 A | 6/2012 |
|---|---|---|
| CN | 103630755 A | 3/2014 |
| CN | 103973143 A | 8/2014 |
| CN | 105717368 A | 6/2016 |

* cited by examiner

*Primary Examiner* — Jeffrey A Gblende
(74) *Attorney, Agent, or Firm* — CKC & Partners Co., Ltd.

(57) ABSTRACT

A method for estimating capacitance applied to a three phase converting device is disclosed. The three phase converting device includes a three phase converter and a processor. The processor executes following steps: (a) outputting a non-baseband signal to the three phase converter, such that a bus voltage of the three phase converter generates a non-baseband flutter; (b) obtaining the bus voltage of the three phase converter; (c) obtaining a bus voltage estimating value based on the bus voltage, a bus capacitance estimating value, an input power, and an output power of the three phase converter; (d) respectively outputting a first AC component and a second AC component corresponding to the non-baseband flutter through filtering the bus voltage and the bus voltage estimating value by a filter segment; (e) estimating a bus capacitance based on the first AC component, the second AC component and a bus capacitance initial value.

18 Claims, 5 Drawing Sheets

THREE PHASE CONVERTING DEVICE AND METHOD FOR ESTIMATING CAPACITANCE

RELATED APPLICATIONS

This application claims priority to China Application Serial Number 201710652487.5, filed Aug. 2, 2017, which is herein incorporated by reference.

BACKGROUND

Field of Invention

The present disclosure relates to a converting device and a method for estimating a parameter value of an internal element. More particularly, the present disclosure relates to a three phase converting device and a method for estimating a capacitance of the three phase converting device.

Description of Related Art

In a three phase system (such as in a system like a converter, a frequency converter, etc.), the value of direct current (DC) bus capacitance has a certain degree of influence on the stability of system operation. The DC bus capacitance value needs to be quickly and accurately detected online so as to reasonably assess the capacitor life and, if necessary, give a warning to carry out maintenance in a timely manner so as to ensure the stable operation of the system.

Currently, there are several methods for detecting the DC bus capacitance value of a three phase system. For example, an independent detection device can be adopted to directly connect two terminals of the capacitor so as to calculate the bus capacitance. The power and control of the independent detection device are provided independently without relying on the three phase system. For example, a large inductor is added to the AC side, and the resonant effect between the inductor and capacitor is utilized to calculate the bus capacitance value. However, if the above method is adopted to carry out the detection, an external device is necessary to cause a higher cost.

In addition, if the detection is based on the three phase converter itself, the detection method usually needs to be combined with the situation to which the product is applied, which is disadvantageous to promotion and application. For example, an elevator company combines the DC side capacitance estimation with the information of elevator compartment position. Additionally, detection based on the three phase converter itself, such as estimating the capacitance value during the pre-charge process of the three phase converter DC bus, may result in the following disadvantages: (1). The capacitance value can only be detected once during the pre-charge process, and the capacitance value change cannot be detected during steady operation; (2). Energy carried by the capacitor that is estimated through the power may be inaccurate, which affects the accuracy of capacitance value estimation. In addition to that, detection based on the three phase converter itself, in which the ripple voltage of the bus voltage is acquired during the operation process of the three phase converter and the capacitance value is directly estimated based on capacitor characteristics, may result in the following disadvantage: the high frequency ripple is difficult to be accurately detected, thus affecting the accuracy of capacitance value estimation.

For the foregoing reasons, there is a need to solve the above-mentioned problems by providing a three phase converting device and a method for estimating capacitance.

SUMMARY

The summary aims to provide a brief description of the disclosure so that readers can understand the disclosure fundamentally. The summary does not describe the disclosure completely, and does not intend to specify the important/critical elements of the embodiments of the present disclosure or limit the scope of the present disclosure.

A method for estimating capacitance is provided. The method for estimating capacitance is applied to a three phase converting device. The three phase converting device comprises a three phase converter and a processor, and the processor is configured to execute the following steps: (a). outputting a non-baseband signal to the three phase converter, such that a bus voltage of the three phase converter generates a non-baseband flutter; (b). obtaining the bus voltage of the three phase converter; (c). obtaining a bus voltage estimating value based on the bus voltage, a bus capacitance estimating value, an input power, and an output power of the three phase converter; (d). respectively outputting a first AC component and a second AC component corresponding to the non-baseband flutter through filtering the bus voltage and the bus voltage estimating value by a filter segment; and (e). estimating a bus capacitance based on the first AC component, the second AC component, and a bus capacitance initial value.

In some embodiments, in step (a) the non-baseband signal is a double frequency signal, such that the bus voltage generates a double frequency flutter.

In some embodiments, step (c) comprises: step (c1): performing a closed-loop control on the bus voltage estimating value, such that a difference between the bus voltage and the bus voltage estimating value is regulated and is then multiplied by the bus capacitance estimating value to obtain the input power; step (c2): calculating the output power based on an output voltage and an output current of the three phase converter, and subtracting the output power from the input power to obtain power of the bus capacitor; and step (c3): calculating the bus voltage estimating value based on the power of the bus capacitor, the bus capacitance estimating value, and an average of the bus voltage.

In some embodiments, the filter segment comprises a first bandpass filter module configured to output the first AC component and a second bandpass filter module configured to output the second AC component. The first AC component is related to the bus voltage. The second AC component is related to the bus voltage estimating value.

In some embodiments, both the first bandpass filter module and the second bandpass filter module are biquadratic bandpass filters, and both the first AC component and the second AC component are double frequency AC components.

In some embodiments, step (e) comprises: step (e1): acquiring a peak value of the first AC component and a peak value of the second AC component, and performing an inverse operation on the peak values to respectively obtain a first signal and a second signal; step (e2): calculating a difference between the first signal and the second signal and regulating the difference so as to obtain a bus capacitance deviation value; and step (e3): adding the bus capacitance deviation value to the bus capacitance initial value to obtain an estimated bus capacitance.

In some embodiments, the bus capacitance estimating value is updated in a real-time manner according to the estimated bus capacitance.

In some embodiments, the bus capacitance estimating value is the bus capacitance initial value.

In some embodiments, wherein step (e) comprises: step (e1): acquiring a peak value of the first AC component and a peak value of the second AC component, and performing an inverse operation on the peak values to respectively obtain a first signal and a second signal; step (e2): calculating a difference between the first signal and the second signal, and performing a droop control on the difference to obtain a bus capacitance deviation value; and step (e3): adding the bus capacitance deviation value to the bus capacitance initial value to obtain an estimated bus capacitance.

The present disclosure provides a three phase converting device. A non-baseband signal is input to a three phase converter, such that a bus voltage of the three phase converter generates a non-baseband flutter. The three phase converting device comprises the three phase converter, a bus voltage estimator, and a bus capacitance estimator. The bus voltage estimator obtains the bus voltage of the three phase converter, and obtains a bus voltage estimating value based on the bus voltage, a bus capacitance estimating value, an input power, and an output power of the three phase converter. The bus capacitance estimator is configured to filter the bus voltage and the bus voltage estimating value to respectively output a first AC component and a second AC component corresponding to the non-baseband flutter. The bus capacitance estimator is further configured to estimate a bus capacitance based on the first AC component, the second AC component, and a bus capacitance initial value.

In some embodiments, the non-baseband signal is a double frequency signal, such that the bus voltage generates a double frequency flutter.

In some embodiments, the bus voltage estimator is configured to perform a closed-loop control on the bus voltage estimating value. The bus voltage estimator comprises a first logical module, a first regulation module, a bus capacitance acquisition module, a second logical module, and a bus voltage estimating module. The first logical module is configured to obtain a difference between the bus voltage and the bus voltage estimating value. The first regulation module is configured to regulate the difference between the bus voltage and the bus voltage estimating value to obtain a regulating signal. The bus capacitance acquisition module is configured to multiply the regulating signal by the bus capacitance estimating value to obtain the input power. The second logical module is configured to obtain the output power, and subtract the output power from the input power to obtain power of the bus capacitor. The bus voltage estimating module is configured to calculate the bus voltage estimating value based on the power of the bus capacitor, the bus capacitance estimating value, and an average of the bus voltage.

In some embodiments, the bus capacitance estimator comprises a first bandpass filter module and a second bandpass filter module. The first bandpass filter module is configured to output the first AC component. The second bandpass filter module is configured to output the second AC component. The first AC component is related to the bus voltage. The second AC component is related to the bus voltage estimating value.

In the foregoing, both the first bandpass filter module and the second bandpass filter module are biquadratic bandpass filters, and both the first AC component and the second AC component are double frequency AC components.

In some embodiments, the bus capacitance estimator further comprises a peak value acquisition module, an inverse operation module, a third logical module, a second regulation module, and a fourth logical module. The peak value acquisition module is configured to acquire a peak value of the first AC component and a peak value of the second AC component. The inverse operation module is configured to perform an inverse operation on the peak values to respectively obtain a first signal and a second signal. The third logical module is configured to calculate a difference between the first signal and the second signal. The second regulation module is configured to regulate the difference between the first signal and the second signal to obtain a bus capacitance deviation value. The fourth logical module is configured to add the bus capacitance deviation value to the bus capacitance initial value to obtain an estimated bus capacitance.

In some embodiments, the bus capacitance estimating value is updated in a real-time manner according to the estimated bus capacitance.

In some embodiments, the bus capacitance estimating value is the bus capacitance initial value.

In some embodiments, the bus capacitance estimator further comprises a peak value acquisition module, an inverse operation module, a third logical module, a droop control module, and a fourth logical module. The peak value acquisition module is configured to acquire a peak value of the first AC component and a peak value of the second AC component. The inverse operation module is configured to perform an inverse operation on the peak values to respectively obtain a first signal and a second signal. The third logical module is configured to calculate a difference between the first signal and the second signal. The droop control module is configured to perform a droop control on the difference between the first signal and the second signal to obtain a bus capacitance deviation value. The fourth logical module is configured to add the bus capacitance deviation value to the bus capacitance initial value to obtain an estimated bus capacitance.

Therefore, a three phase converting device and a method for estimating capacitance are provided according to the embodiments of the present disclosure to improve the problems that an external device is required and the cost is higher when an independent detection device is adopted to calculate and obtain the bus capacitance of the three phase converting device. In addition, various problems occurring when detection is based on the three phase converter itself, such as the capacitance estimation being combined with some other information, the capacitance value only being detected once during the pre-charge process, the use of high-frequency ripple being difficult to accurately detect and that in turn affects the capacitance estimation accuracy, etc., are improved. The method for estimating capacitance according to the present disclosure can achieve the online detection of capacitance value in a real-time manner and have a low cost.

Owing to the above device design or operation method, the power converting device is a bi-directional power converting device having a wide adaptability, and is able to be adapted to wide ranges of battery voltage and grid voltage. In addition, the power converting device has a high conversion efficiency and safety isolation between the input and output terminals.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

According to the usual mode of operation, various features and elements in the figures have not been drawn to scale, which are drawn to the best way to present specific features and elements related to the present disclosure. In addition, among the different figures, the same or similar elements symbols refer to similar elements/components.

DESCRIPTION OF THE EMBODIMENTS

To make the contents of the present disclosure more thorough and complete, the following illustrative description is given with regard to the implementation aspects and embodiments of the present disclosure, which is not intended to limit the scope of the present disclosure. The features of the embodiments and the steps of the method and their sequences that constitute and implement the embodiments are described. However, other embodiments may be used to achieve the same or equivalent functions and step sequences.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include the singular. Specifically, as used herein and in the claims, the singular forms "a" and "an" include the plural reference unless the context clearly indicates otherwise.

As used herein, "couple" refers to direct physical contact or electrical contact or indirect physical contact or electrical contact between two or more elements. Or it can also refer to reciprocal operations or actions between two or more elements.

Figure 1:
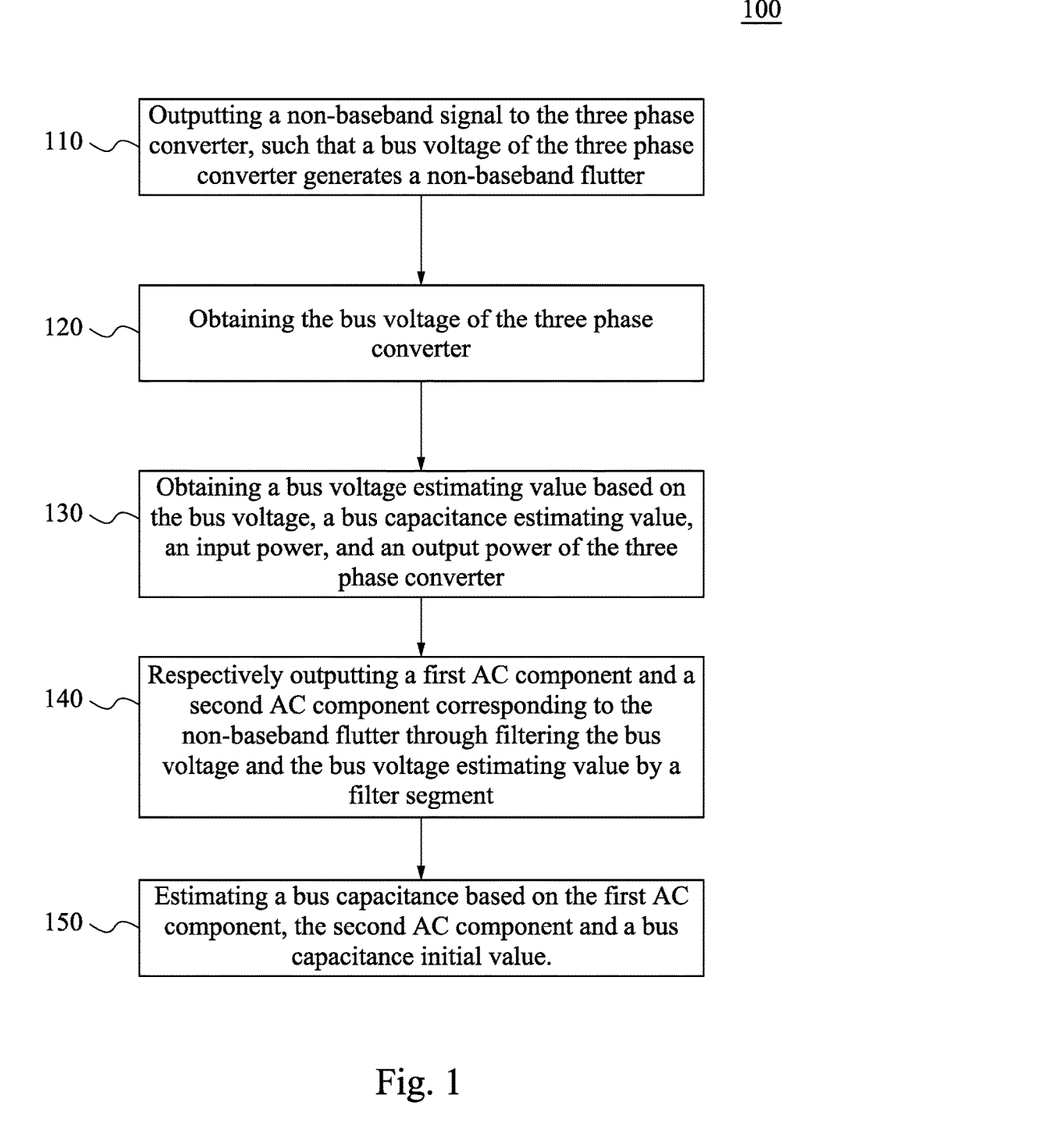
FIG. 1 depicts a schematic flowchart of a method for estimating capacitance according to one embodiment of the present disclosure.

FIG. 1 depicts a schematic flowchart of a method 100 for estimating capacitance according to one embodiment of the present disclosure. As shown in FIG. 1, the method 100 for estimating capacitance comprises the steps as follows:

Step 110, outputting a non-baseband signal to a three phase converter, such that a bus voltage of the three phase converter generates a non-baseband flutter;

Step 120, obtaining the bus voltage of the three phase converter;

Step 130, obtaining a bus voltage estimating value based on the bus voltage, a bus capacitance estimating value, an input power, and an output power of the three phase converter;

Step 140, respectively outputting a first alternating current (AC) component and a second AC component corresponding to the non-baseband flutter through filtering the bus voltage and the bus voltage estimating value by a filter segment; and Step 150, estimating a bus capacitance based on the first AC component, the second AC component, and a bus capacitance initial value.

Figure 2:
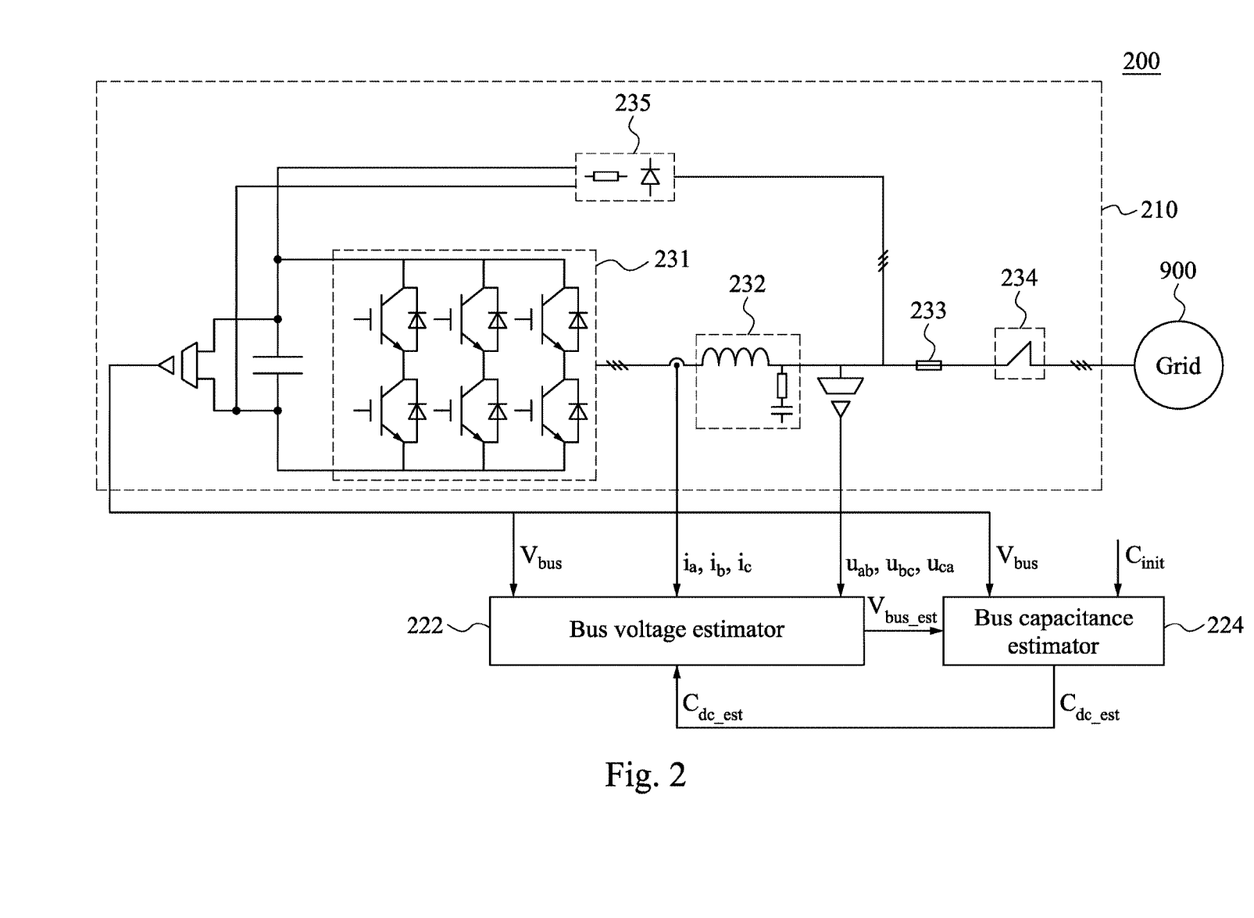
FIG. 2 depicts a schematic diagram of a three phase converting device according to one embodiment of the present disclosure.

In order to facilitate the understanding of the steps of the method 100 for estimating capacitance, a description is provided with reference to FIG. 2. FIG. 2 depicts a schematic diagram of a three phase converting device 200 according to one embodiment of the present disclosure. As shown in FIG. 2, the three phase converting device 200 comprises a three phase converter 210, a bus voltage estimator 222, and a bus capacitance estimator 224. As for the structure, both the bus voltage estimator 222 and the bus capacitance estimator 224 are coupled to the three phase converter 210. In addition, the bus voltage estimator 222 and the bus capacitance estimator 224 are coupled to each other.

Additionally, the three phase converter 210 comprises a grid side converter 231, an inductor-capacitor filter 232, an AC fuse 233, a grid side main connector 234, and a soft-start module 235. The inductor-capacitor filter 232 coupled to the grid side converter 231 is used for filtering an output of the grid side converter 231. The AC fuse 233 is coupled between the inductor-capacitor filter 232 and the grid side main connector 234. The grid side main connector 234 is used for connecting a grid. The soft-start module 235 is coupled to the grid side converter 231 and the inductor-capacitor filter 232.

A description is provided with reference to step 110. The non-baseband signal is output to the three phase converter 210, such that the bus voltage of the three phase converter 210 generates the non-baseband flutter. In step 120, the bus voltage of the three phase converter 210 can be obtained by using the bus voltage estimator 222.

Figure 3:
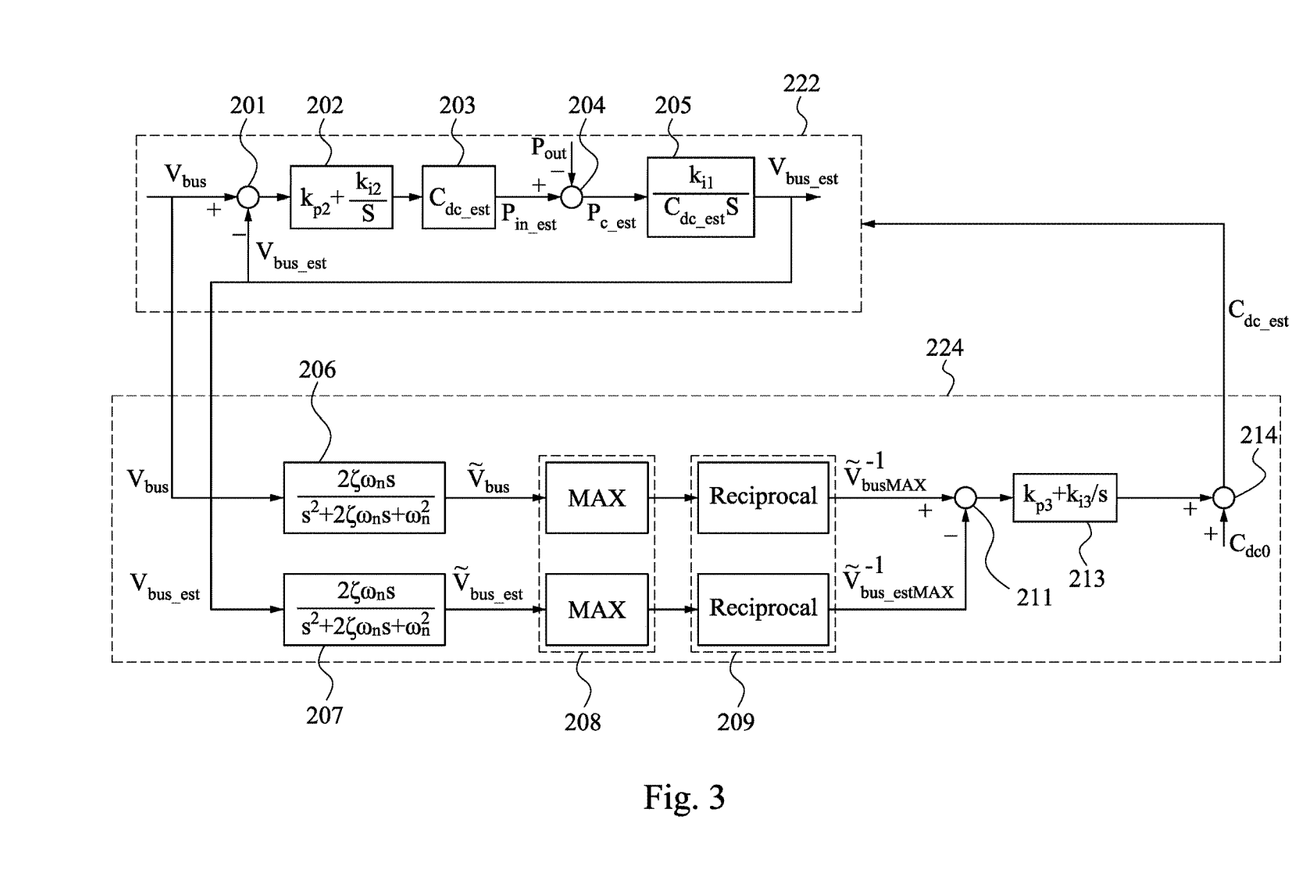
FIG. 3 depicts a control block diagram of part of a circuit of the three phase converting device in FIG. 2 according to another embodiment of the present disclosure.

In order to facilitate the understanding of step S130, a description is provided with reference to FIG. 3. FIG. 3 depicts a control block diagram of part of a circuit of the three phase converting device 200 in FIG. 2 according to another embodiment of the present disclosure. In step 130, a bus voltage estimating value $V_{bus\_est}$ can be obtained by using the bus voltage estimator 222 based on a bus voltage $V_{bus}$, a bus capacitance estimating value $C_{dc\_est}$, an input power $P_{in\_est}$, and an output power $P_{out}$ of the three phase converter 210.

In step 140, the bus capacitance estimator 224 can be used to filter the bus voltage $V_{bus}$ and the bus voltage estimating value $V_{bus\_est}$ so as to respectively output a first AC component $\tilde{V}_{bus}$ and a second AC component $\tilde{V}_{bus\_est}$ corresponding to the non-baseband flutter. In step 150, the bus capacitance estimator 224 can be used to estimate the bus capacitance based on the first AC component $\tilde{V}_{bus}$, the second AC component $\tilde{V}_{bus\_est}$, and a bus capacitance initial value $C_{dc0}$.

In some embodiments, the above non-baseband signal is a double frequency signal, thus causing the bus voltage $V_{bus}$ to generate a double frequency flutter.

In another embodiment, the above step 130 comprises the flow as follows:

Step 132, performing a closed-loop control on the bus voltage estimating value such that a difference between the bus voltage and the bus voltage estimating value is regulated and is then multiplied by the bus capacitance estimating value to obtain the input power.

Step 134, calculating the output power based on an output voltage and an output current of the three phase converter, and subtracting the output power from the input power to obtain power of the bus capacitor; and Step 136, calculating the bus voltage estimating value based on the power of the bus capacitor, the bus capacitance estimating value, and an average of the bus voltage.

A description is provided with reference to the step 132. The bus voltage estimator 222 can be used to perform the closed-loop control on the bus voltage estimating value $V_{bus\_est}$, and a first logical module 201 of the bus voltage estimator 222 is used to calculate the difference between the bus voltage $V_{bus}$ and the bus voltage estimating value $V_{bus\_est}$. Then, a first regulation module 202 of the bus voltage estimator 222 is used to regulate the difference so as to obtain a regulating signal, and a bus capacitance acquisition module 203 is further used to multiply the regulating signal by the bus capacitance estimating value $C_{dc\_est}$ so as to obtain the input power $P_{in\_est}$. The first regulation module 202 is a proportional integral regulator, but the present disclosure is not limited in this regard. A proportional coefficient $k_{p2}$ and an integral coefficient $k_{i2}$ can be calculated by the following equations. The first regulation module 202 and the bus capacitance acquisition module 203 constitute a calculation segment of the input power.

In the step 134, an output power $P_{out}$ is calculated based on the output voltage and the output current of the three phase converter 210, and a second logical module 204 of the bus voltage estimator 222 is used to subtract the output power $P_{out}$ from the input power $P_{in\_est}$ so as to obtain the power of the bus capacitor $P_{c\_est}$.

In the step 136, the bus voltage estimating value $V_{bus\_est}$ can be obtained by using a bus voltage estimating module 205 based on the power of the bus capacitor $P_{c\_est}$, the bus capacitance estimating value $C_{dc\_est}$, and the average $V_{bus\_ave}$ of the bus voltage $V_{bus}$.

In still another embodiment, the filter segment of the bus capacitance estimator 224 comprises a first bandpass filter module 206 and a second bandpass filter module 207. The first bandpass filter module 206 is configured to filter the bus voltage $V_{bus}$ and output a first AC component $\tilde{V}_{bus}$. The second bandpass filter module 207 is configured to filter the bus voltage estimating value $V_{bus\_est}$ and output a second AC component $\tilde{V}_{bus\_est}$. In yet another embodiment, both the first bandpass filter module 206 and the second bandpass filter module 207 are biquadratic bandpass filters, and both the first AC component $\tilde{V}_{bus}$ and the second AC component $\tilde{V}_{bus\_est}$ are double frequency AC components.

In one embodiment, the above step 150 comprises the steps as follows:

Step 152, acquiring a peak value of the first AC component and a peak value of the second AC component, and performing an inverse operation on the peak values to respectively obtain a first signal $\tilde{V}^{-1}_{busMAX}$ and a second signal $\tilde{V}^{-1}_{bus\_estMAX}$.

Step 154, calculating a difference between the first signal and the second signal and regulating the difference so as to obtain a bus capacitance deviation value, such as a proportional integral regulation, but the present disclosure being not limited in this regard, wherein a proportional coefficient $k_{p3}$ and an integral coefficient $k_{i3}$ in the proportional integral regulation may be set and adjusted depending on practical situations, such as obtaining through multiple experiments; and Step 156, adding the bus capacitance deviation value to the bus capacitance initial value to obtain an estimated bus capacitance.

A description is provided with reference to the step 152. A peak value acquisition module 208 of the bus capacitance estimator 224 can be used to obtain the peak value of the first AC component $\tilde{V}_{bus}$ and the peak value of the second AC component $\tilde{V}_{bus\_est}$. An inverse operation module 209 of the bus capacitance estimator 224 is then used to perform the inverse operation on the peak values so as to respectively obtain a first signal $\tilde{V}^{-1}_{busMAX}$ and a second signal $\tilde{V}^{-1}_{bus\_estMAx}$.

A description is provided with reference to the step 154. A third logical module 211 of the bus capacitance estimator 224 can be used to calculate the difference between the first signal $\tilde{V}^{-1}_{busMAX}$ and the second signal $\tilde{V}^{-1}_{bus\_estMAX}$. Then, a second regulation module 213 of the bus capacitance estimator 224 is used to regulate the difference so as to obtain the bus capacitance deviation value. The second regulation module 213 may be a proportional integral regulator, but the present disclosure is not limited in this regard.

A description is provided with reference to the step 156. A fourth logical module 214 of the bus capacitance estimator 224 can be used to add the bus capacitance deviation value to the bus capacitance initial value $C_{dc0}$ so as to obtain the estimated bus capacitance.

In another embodiment, the bus capacitance estimating value $C_{dc\_est}$ in the bus voltage estimator 222 is updated in a real-time manner according to the estimated bus capacitance obtained by the bus capacitance estimator 224 until the entire control loop is stable. The bus capacitance estimating value $C_{dc\_est}$ that is finally obtained is a bus capacitance that is estimated. During the initialization process, the bus capacitance estimating value $C_{dc\_est}$ is set as the bus capacitance initial value $C_{dc0}$ and is updated in a real-time manner in subsequent processes.

The above detailed description of the steps illustrates the scheme corresponding to the closed-loop implementation mode provided by the present disclosure, and is suitable for situations where the accuracy requirement for the on-line estimation of bus capacitance is higher. The present disclosure further provides an open-loop implementation mode. The calculation is simple, and the execution speed is fast, which is suitable for situations where the accuracy requirement for the on-line estimation of bus capacitance is lower.

Figure 4:
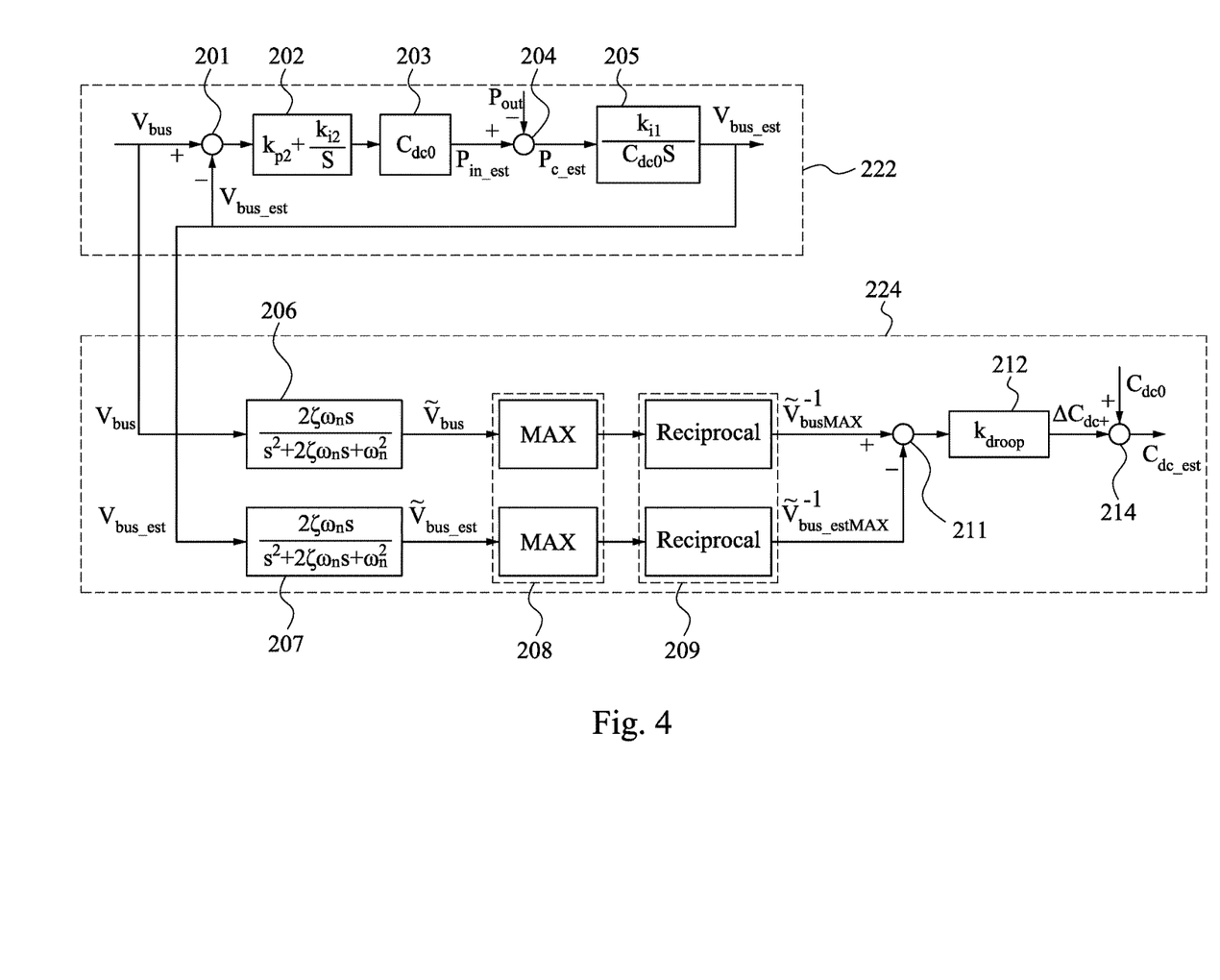
FIG. 4 depicts a control block diagram of part of a circuit of the three phase converting device in FIG. 2 according to still another embodiment of the present disclosure.

In another implementation mode, a description is provided with reference to FIG. 4 to facilitate the understanding of the step 150. FIG. 4 depicts a control block diagram of part of a circuit of the three phase converting device 200 in FIG. 2 according to still another embodiment of the present disclosure. The above step 150 comprises the steps as follows:

Step 152, acquiring a peak value of the first AC component and a peak value of the second AC component, and performing an inverse operation on the peak values to respectively obtain a first signal and a second signal.

Step 154, calculating a difference between the first signal and the second signal, and performing a droop control on the difference to obtain a bus capacitance deviation value; and Step 156, adding the bus capacitance deviation value to the bus capacitance initial value to obtain an estimated bus capacitance.

A description is provided with reference to the step 152. The peak value acquisition module 208 of the bus capacitance estimator 224 can be used to obtain the peak value of the first AC component $\tilde{V}_{bus}$ and the peak value of the second AC component $\tilde{V}_{bus\_est}$. Then, the inverse operation module 209 of the bus capacitance estimator 224 is used to perform the inverse operation on the peak values so as to respectively obtain the first signal $\tilde{V}^{-1}_{busMAX}$ and the second signal $\tilde{V}^{-1}_{bus\_estMAX}$.

A description is provided with reference to the step 154. The third logical module 211 of the bus capacitance estimator 224 can be used to calculate the difference between the first signal $\tilde{V}^{-1}_{busMAX}$ and the second signal $\tilde{V}^{-1}_{bus\_estMAX}$. Then, a droop control module 212 of the bus capacitance estimator 224 is used to perform the droop control on the difference so as to obtain the bus capacitance deviation value. A droop control coefficient $k_{droop}$ can be obtained through the following equations.

A description is provided with reference to the step 156. The fourth logical module 214 of the bus capacitance estimator 224 can be used to add the bus capacitance deviation value to the bus capacitance initial value $C_{dc0}$ so as to obtain the estimated bus capacitance.

As compared with the closed-loop implementation mode, the bus capacitance estimating value $C_{dc\_est}$ in the bus voltage estimator 222 remains at the bus capacitance initial value $C_{dc0}$ in the open-loop implementation mode until the entire control loop is stable. The bus capacitance estimating value $C_{dc\_est}$ that is finally obtained is a bus capacitance that is estimated.

Figure 5:
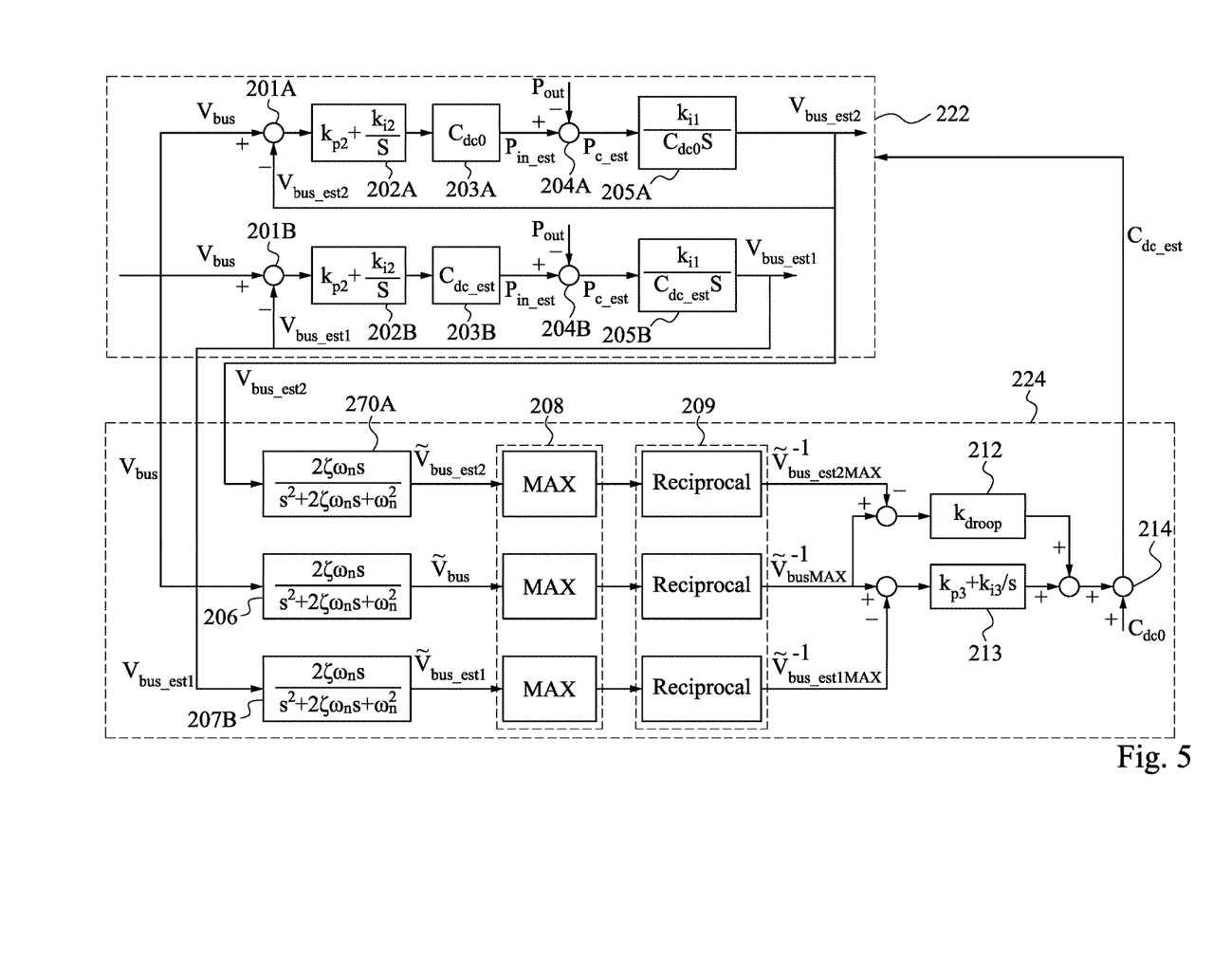
FIG. 5 depicts a control block diagram of part of a circuit of the three phase converting device in FIG. 2 according to yet another embodiment of the present disclosure.

In yet another implementation mode, feedforward regulation may be added to the bus capacitance estimator 224 to speed up the response. In greater detail, as shown in FIG. 5, the freeforward regulation is implemented by using a droop control module 212. Inputs of the droop control module 212 are the first signal $\tilde{V}^{-1}_{busMAX}$ and a third signal $\tilde{V}^{-1}_{bus\_est2MAX}$ obtained based on an AC component of a second bus voltage estimating value $V_{bus\_est2}$. A second bus voltage estimating module is added to the bus voltage estimator 222, such that the second bus voltage estimating value $V_{bus\_est2}$ is estimated based on the bus capacitance initial value $C_{dc0}$. Since a detailed process has been described above, a description in this regard is not provided. An output of the droop control module 212 is a deviation signal, which is superimposed on an output of the second regulation module 213 to obtain a bus capacitance deviation value. Since other segments of FIG. 5 are similar to those of FIG. 3, a description in this regard is not provided.

For example, after a negative sequence current is injected into the three phase converter, negative sequence power is generated. Hence, the bus voltage generates a double frequency flutter (as shown in step 110 of FIG. 1). A bus capacitance value is estimated based on a flutter amplitude of the bus voltage. The double frequency flutter of the voltage can be calculated through the relation between the capacitive reactance-current-voltage model and power of the capacitor. The equation is as follows:

$$U_{dc}^2 = \frac{P}{\omega_n C} \quad \text{eq(1)}$$

where $\omega_n = 2\pi \text{rad/s}$.

The design concept of the present disclosure is described as follows. The actual bus voltage comprises two parts, that is, a DC component and an AC component. The estimated bus voltage also comprises two parts, that is, a DC component and an AC component. Therefore, the following method can be used to calculate the desired result step by step:

1. Utilizing a biquadratic low-pass filter to extract a DC component and a double frequency AC component of the actual bus voltage, see equation (2):

$$\tilde{\bar{V}}_{bus} = \frac{\omega_n^2}{s^2 + 2\zeta\omega_n s + \omega_n^2} V_{bus} = \bar{V}_{bus} + \frac{1}{2\zeta}\tilde{V}_{bus} \quad \text{eq(2)}$$

2. Utilizing a biquadratic bandpass filter to extract the double frequency AC component of the actual bus voltage, see equation (3):

$$\tilde{V}_{bus} = \frac{2\zeta\omega_n s}{s^2 + 2\zeta\omega_n s + \omega_n^2} V_{bus} \quad \text{eq(3)}$$

3. Calculating a total output power to obtain the estimated bus voltage based on the equation (1), and utilizing the biquadratic bandpass filter to extract a double frequency AC component of the estimated bus voltage obtained from equation (1), see equation (4):

$$\tilde{V}^*_{bus\_est} = \frac{2\zeta\omega_n s}{s^2 + 2\zeta\omega_n s + \omega_n^2} \frac{P_{out}}{2\zeta\omega_n C_{dc\_est} V_{bus\_ave}} = \frac{1}{2\zeta}\tilde{V}_{bus\_est} \quad \text{eq(4)}$$

4. When the double frequency AC component of the estimated bus voltage and the double frequency AC component of the actual bus voltage can cancel each other out, the estimated bus voltage being exactly the same as the actual bus voltage;

5. When the estimated bus capacitance is consistent with the actual bus capacitance, the double frequency AC component of the estimated bus voltage and the double frequency AC component of the actual bus voltage being able to cancel each other out. See equations (5) and (6) for the mathematical model:

$$V_{bus\_est} = \frac{2\zeta\omega_n s}{s^2 + 2\zeta\omega_n s + \omega_n^2} V_{bus} + \quad \text{eq(5)}$$

$$\frac{\omega_n^2}{s^2 + 2\zeta\omega_n s + \omega_n^2} V_{bus} - \frac{2\zeta\omega_n s}{s^2 + 2\zeta\omega_n s + \omega_n^2} \frac{P_{out}}{2\zeta\omega_n C_{dc\_est} V_{bus\_ave}}$$

$$V_{bus\_est} = \bar{V}_{bus} + \tilde{V}_{bus} + \frac{1}{2\zeta}\tilde{V}_{bus} - \frac{1}{2\zeta}\tilde{V}_{bus\_est} = V_{bus} \quad \text{eq(6)}$$

After equation (6) is rearranged, the following equation (7) being obtained:

$$V_{bus\_est} = \quad \text{eq(7)}$$

$$(V_{bus} - V_{bus\_est})\left(2\zeta\omega_n C_{dc\_est} V_{bus\_ave} + \frac{C_{dc\_est} V_{bus\_ave} \omega_n^2}{s}\right) -$$

$$P_{out}\left((V_{bus} - V_{bus\_est})\left(k_{p2} + \frac{k_{i2}}{s}\right)C_{dc\_est} - P_{out}\right)\frac{k_{i1}}{C_{dc\_est} s} =$$

-continued $$(P_{in\_est} - P_{out}) \frac{k_{i1}}{C_{dc\_est}s}$$

Where $k_{i1}=1/(V_{bus\_ave})$, $k_{p2}=2\zeta\times\omega_n V_{bus\_ave}$, $k_{i2}=V_{bus\_ave}\omega_n^2$.

It can be seen from the above calculation method that the closed-loop control is performed on the bus voltage estimating value. The input power is obtained through the proportional integral regulator (PI regulator), and the difference between the input power and the output power is calculated to obtain the power of the capacitor. The capacitor current is then obtained based on the power of the capacitor and the average $V_{bus\_ave}$ of the bus voltage $V_{bus}$. According to the characteristics of the capacitor, the estimated bus voltage is obtained by integrating the capacitor current, and the closed-loop control is completed. The above calculation flow can be presented as the circuit control block diagrams shown in FIG. 3 and FIG. 4.

In addition, the design concept of the closed-loop control scheme is described as follows. A negative sequence current is injected to result in a double frequency flutter of the voltage. The power flutter triggers the voltage flutter. The peak voltage of the voltage flutter is extracted to calculate the capacitance according to the following mathematical model.

$$C_{dc\_est} = \frac{P_{out}}{\omega_n \tilde{v}_{bus\_est} V_{bus\_ave}} \quad \text{eq(8)}$$

$$C_{dc\_real} = \frac{P_{out}}{\omega_n \tilde{V}_{bus} V_{bus\_ave}}$$

In the calculation equation, the output power $P_{out}$ is used to replace the power of the capacitor because the two are basically equal. The difference lies mainly in the power loss caused by the internal impedance of the bus capacitor and can be ignored. Based on theoretical analysis, when the estimated capacitance is consistent with the actual capacitance, amplitudes of double baseband flutters thus generated of the actual bus voltage and the estimated bus voltage are consistent if same negative sequence power is injected. The biquadratic bandpass filters are used to extract the double frequency component of the measured bus voltage and the double frequency component of the estimated bus voltage. Then, peak values are extracted. After the reciprocals are taken, the closed-loop control is performed according to the architecture shown in FIG. 3. Extracting the peak values facilitates digital calculations.

In addition, the design concept of the open-loop control scheme is described as follows. A negative sequence current is injected into the three phase converter to result in a double frequency flutter of the voltage. The power flutter triggers the voltage flutter. The peak value of the voltage flutter is extracted to calculate the capacitance according to the mathematical model of equation (8). Based on theoretical analysis, the biquadratic bandpass filters are used to extract the double frequency component of the measured bus voltage and the double frequency component of the estimated bus voltage. Then, peak values are extracted. After the reciprocals are taken, the open-loop control is performed according to the architecture shown in FIG. 4.

Injecting a double frequency signal is taken as an example to provide a brief description of a signal injection method. The control strategy of a traditional three phase converting device is to use a double closed-loop system that comprises a closed-loop control of the bus voltage and a closed-loop control of the AC side current. An active baseband current is given as the output of the bus voltage control loop. The control objective for the double frequency AC component is to control the double frequency component of current to zero, or control the double frequency flutter of bus voltage to zero. In one embodiment, the double frequency current component is added to the given fixed current to be superposed on the baseband so as to become the double frequency flutter. As a result, the double frequency component is generated in the AC side current. The double frequency flutter is generated in the power on the bus to correspondingly generate the double frequency flutter in the bus voltage. The above description only provides a non-baseband signal injection method, and the present disclosure is not limited in this regard.

In addition, those skilled in the art will appreciate that each of the steps of the method 100 for estimating capacitance named after the function thereof is merely used to describe the technology in the embodiment of the present disclosure in detail but not limited to. Therefore, combining the steps of said method into one step, dividing the steps into several steps, or rearranging the order of the steps is within the scope of the embodiment in the present disclosure.

It can be seen from the above embodiments that the present disclosure has the following advantages, at least. A three phase converting device and a method for estimating capacitance are provided according to the embodiments of the present disclosure to improve the problems that an external device is required and the cost is higher when an independent detection device is adopted to calculate and obtain the bus capacitance of the three phase converting device. In addition, various problems occurring when detection is based on the three phase converter itself, such as the capacitance estimation being combined with some other information, the capacitance value only being detected once during the pre-charge process, the use of high-frequency ripple being difficult to accurately detect and that in turn affects the capacitance estimation accuracy, etc., are improved.

The method for estimating capacitance according to the present disclosure does not rely on an external detection circuit or device. The DC bus capacitance value can be accurately detected in a real-time manner to complete the online detection of the DC bus capacitance, thus being especially suitable for a three phase converting device.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for estimating capacitance applied to a three phase converting device, wherein the three phase converting device comprises a three phase converter and a processor, and the processor is configured to execute the following steps:

(a): outputting a non-baseband signal to the three phase converter, such that a bus voltage of the three phase converter generates a non-baseband flutter;
(b): obtaining the bus voltage of the three phase converter;
(c): obtaining a bus voltage estimating value based on the bus voltage, a bus capacitance estimating value, an input power, and an output power of the three phase converter;
(d): respectively outputting a first AC component and a second AC component corresponding to the non-baseband flutter through filtering the bus voltage and the bus voltage estimating value by a filter segment; and
(e): estimating a bus capacitance based on the first AC component, the second AC component, and a bus capacitance initial value.

2. The method for estimating capacitance of claim 1, wherein in step (a), the non-baseband signal is a double frequency signal, such that the bus voltage generates a double frequency flutter.

3. The method for estimating capacitance of claim 1, wherein step (c) comprises:
step (c1): performing a closed-loop control on the bus voltage estimating value, such that a difference between the bus voltage and the bus voltage estimating value is regulated and is then multiplied by the bus capacitance estimating value to obtain the input power;
step (c2): calculating the output power based on an output voltage and an output current of the three phase converter, and subtracting the output power from the input power to obtain a power of the bus capacitor; and
step (c3): calculating the bus voltage estimating value based on the power of the bus capacitor, the bus capacitance estimating value, and an average of the bus voltage.

4. The method for estimating capacitance of claim 3, wherein the filter segment comprises a first bandpass filter module configured to output the first AC component and a second bandpass filter module configured to output the second AC component, wherein the first AC component is related to the bus voltage, and the second AC component is related to the bus voltage estimating value.

5. The method for estimating capacitance of claim 4, wherein both the first bandpass filter module and the second bandpass filter module are biquadratic bandpass filters, and both the first AC component and the second AC component are double frequency AC components.

6. The method for estimating capacitance of claim 5, wherein step (e) comprises:
step (e1): acquiring a peak value of the first AC component and a peak value of the second AC component, and performing an inverse operation on the peak values to respectively obtain a first signal and a second signal;
step (e2): calculating a difference between the first signal and the second signal and regulating the difference so as to obtain a bus capacitance deviation value; and
step (e3): adding the bus capacitance deviation value to the bus capacitance initial value to obtain an estimated bus capacitance.

7. The method for estimating capacitance of claim 6, wherein the bus capacitance estimating value is updated in a real-time manner according to the estimated bus capacitance.

8. The method for estimating capacitance of claim 5, wherein the bus capacitance estimating value is the bus capacitance initial value.

9. The method for estimating capacitance of claim 8, wherein step (e) comprises:

step (e1): acquiring a peak value of the first AC component and a peak value of the second AC component, and performing an inverse operation on the peak values to respectively obtain a first signal and a second signal;
step (e2): calculating a difference between the first signal and the second signal, and performing a droop control on the difference to obtain a bus capacitance deviation value; and
step (e3): adding the bus capacitance deviation value to the bus capacitance initial value to obtain an estimated bus capacitance.

10. A three phase converting device comprising:
a three phase converter, wherein a non-baseband signal is input to the three phase converter, such that a bus voltage of the three phase converter generates a non-baseband flutter;
a bus voltage estimator configured to obtain the bus voltage of the three phase converter, and further configured to obtain a bus voltage estimating value based on the bus voltage, a bus capacitance estimating value, an input power, and an output power of the three phase converter; and
a bus capacitance estimator configured to filter the bus voltage and the bus voltage estimating value to respectively output a first AC component and a second AC component corresponding to the non-baseband flutter, wherein the bus capacitance estimator is further configured to estimate a bus capacitance based on the first AC component, the second AC component, and a bus capacitance initial value.

11. The three phase converting device of claim 10, wherein the non-baseband signal is a double frequency signal, such that the bus voltage generates a double frequency flutter.

12. The three phase converting device of claim 10, wherein the bus voltage estimator is configured to perform a closed-loop control on the bus voltage estimating value, the bus voltage estimator comprises:
a first logical module configured to obtain a difference between the bus voltage and the bus voltage estimating value;
a first regulation module configured to regulate the difference between the bus voltage and the bus voltage estimating value to obtain a regulating signal;
a bus capacitance acquisition module configured to multiply the regulating signal by the bus capacitance estimating value to obtain the input power;
a second logical module configured to obtain the output power, and subtract the output power from the input power to obtain a power of the bus capacitor; and
a bus voltage estimating module configured to calculate the bus voltage estimating value based on the power of the bus capacitor, the bus capacitance estimating value, and an average of the bus voltage.

13. The three phase converting device of claim 12, wherein the bus capacitance estimator comprises:
a first bandpass filter module configured to output the first AC component; and
a second bandpass filter module configured to output the second AC component;
wherein the first AC component is related to the bus voltage, and the second AC component is related to the bus voltage estimating value.

14. The three phase converting device of claim 13, wherein both the first bandpass filter module and the second bandpass filter module are biquadratic bandpass filters, and both the first AC component and the second AC component are double frequency AC components.

15. The three phase converting device of claim 14, wherein the bus capacitance estimator further comprises:
- a peak value acquisition module configured to acquire a peak value of the first AC component and a peak value of the second AC component;
- an inverse operation module configured to perform an inverse operation on the peak values to respectively obtain a first signal and a second signal;
- a third logical module configured to calculate a difference between the first signal and the second signal;
- a second regulation module configured to regulate the difference between the first signal and the second signal to obtain a bus capacitance deviation value; and
- a fourth logical module configured to add the bus capacitance deviation value to the bus capacitance initial value to obtain an estimated bus capacitance.

16. The three phase converting device of claim 15, wherein the bus capacitance estimating value is updated in a real-time manner according to the estimated bus capacitance.

17. The three phase converting device of claim 14, wherein the bus capacitance estimating value is the bus capacitance initial value.

18. The three phase converting device of claim 17, wherein the bus capacitance estimator further comprises:
- a peak value acquisition module configured to acquire a peak value of the first AC component and a peak value of the second AC component;
- an inverse operation module configured to perform an inverse operation on the peak values to respectively obtain a first signal and a second signal;
- a third logical module configured to calculate a difference between the first signal and the second signal;
- a droop control module configured to perform a droop control on the difference between the first signal and the second signal to obtain a bus capacitance deviation value; and
- a fourth logical module configured to add the bus capacitance deviation value to the bus capacitance initial value to obtain an estimated bus capacitance.

* * * * *